United States Patent [19]

Hardy et al.

[11] Patent Number: 5,192,909
[45] Date of Patent: Mar. 9, 1993

[54] SPECROSCOPIC LOCALIZATION USING PINWHEEL NMR EXCITATION PULSES

[75] Inventors: Christopher J. Hardy, Schenectady; Paul A. Bottomley, Clifton Park; Harvey E. Cline, Schenectady, all of N.Y.

[73] Assignee: General Electric Company, Schenectady, N.Y.

[21] Appl. No.: 637,910

[22] Filed: Jan. 7, 1991

[51] Int. Cl.$^5$ .............................................. G01V 3/00
[52] U.S. Cl. ...................................... 324/309; 324/307
[58] Field of Search .............. 324/309, 307, 300, 314; 128/653 A, 653 AF

[56] References Cited

U.S. PATENT DOCUMENTS

| | | | |
|---|---|---|---|
| 4,748,410 | 5/1988 | Macovski | 324/309 |
| 4,797,616 | 1/1989 | Matsui et al. | 324/309 |
| 4,812,762 | 3/1989 | Den Boef | 324/309 |
| 4,901,021 | 2/1990 | Maeda et al. | 324/309 |
| 4,995,394 | 2/1991 | Cline et al. | 324/309 |

FOREIGN PATENT DOCUMENTS

| | | |
|---|---|---|
| 0024640 | 3/1981 | European Pat. Off. . |
| 0109633 | 5/1984 | European Pat. Off. . |
| 0256779 | 2/1988 | European Pat. Off. . |
| 3837396 | 5/1989 | Fed. Rep. of Germany . |

OTHER PUBLICATIONS

J. Pauly et al., "A k-Space Analysis of Small-Tip-Angle Excitation", Journal of Magnetic Resonance 81, 43-56 (1989) pp. 43-56.

C. J. Hardy et al., "P Spectroscopic Localization Using Pinwheel NMR Excitation Pulses", 8th Annual Meeting of the Society of Magnetic Resonance in Medicine, Amsterdam, Aug. 1989.

C. J. Hardy et al., "A Generalized Approach to Two-Dimensional Selective Excitation", Society of Magnetic Resonance in Medicine, Book of Abstracts, vol. 1, p. 412, Ninth Annual Scientific Meeting and Exhibition, Aug. 18-24, 1990.

C. J. Hardy et al., "Correcting for Nonuniform k-Space Sampling in Two-Dimensional NMR Selective Excitation", Journal of Magnetic Resonance 87, 639-645 (1990).

Primary Examiner—Louis Arana
Attorney, Agent, or Firm—Lawrence P. Zale; Marvin Synder

[57] ABSTRACT

An NMR system performs in vivo localized NMR spectroscopy. A two-dimensional selective RF excitation pulse is used to localize to a cylindrical region of interest, and either phase encoding or slice selective inversion is used to localize to a disk in the cylindrical region of interest. The two-dimensional selective RF excitation is performed in a series of pulse sequences rather than a single pulse sequence, and the resulting series of acquired NMR signals are summed together to substantially cancel signal conributions from outside the cylindrical region of interest.

6 Claims, 9 Drawing Sheets

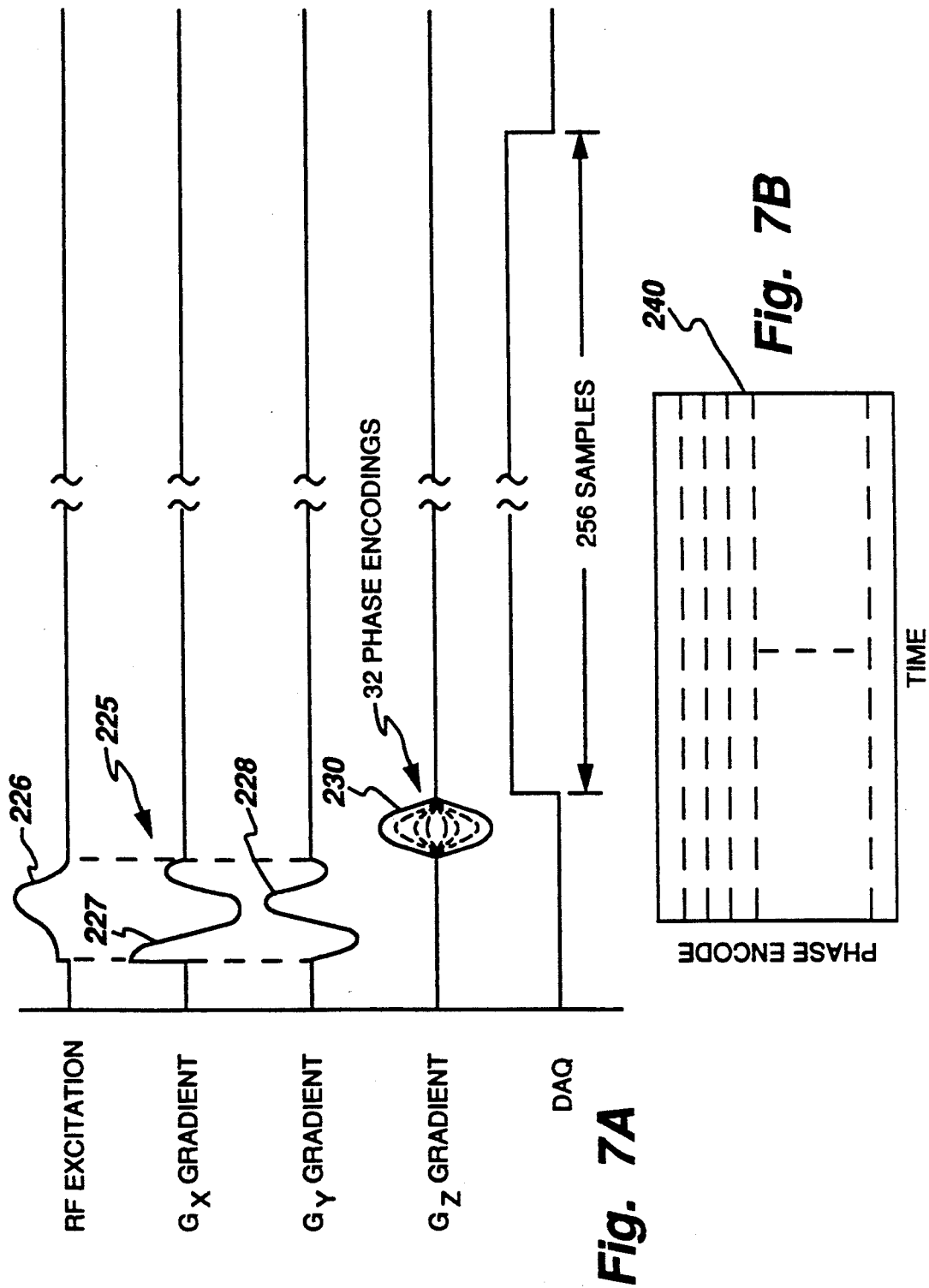

SPECROSCOPIC LOCALIZATION USING PINWHEEL NMR EXCITATION PULSES

BACKGROUND OF THE INVENTION

The field of the invention is nuclear magnetic resonance (NMR) spectroscopy, and in particular, methods for localizing NMR chemical shift spectra of chemical moieties in the body produced during in vivo phosphorus-31, hydrogen-1 ($^1$H), and carbon-13 NMR spectroscopy.

Localized NMR spectroscopy of human organs in vivo has many clinical applications. For example, important metabolites contain phosphorus and the concentration or ratios of these metabolites provide valuable functional information. Abnormal ratios of phosphorus metabolites such as phosphocreatine (PCr), phosphodiesters (PDE), phosphomonoesters (PME) and adenosine triphosphate (ATP) have been observed in several human tumors and can be used not only to detect the tumors, but also, to measure the affect of chemotherapy. Also, the ratio of certain metabolite concentrations has been used to detect severe coronary artery disease without invasive diagnostic measures and before detectable pain is produced. As the instrumentation and methods improve, the measurement of various biochemical compounds and metabolites with spectroscopy will most certainly provide many additional clinical diagnostic benefits The in vivo measurement of metabolite concentrations using NMR presents a number of challenges. Metabolites are at very low concentrations within the human body as compared with water, and as a result, metabolites will never be imaged with anatomical detail comparable to $^1$H images of tissue water. Signals from metabolites must be acquired over a substantial volume of tissue in order to produce an acceptable signal-to-noise ratio. Thus, while the signals may be "localized" to a particular organ or part of an organ, the localized volume from which the signal is acquired is substantially larger than the millimeter-sized voxels common to $^1$H imaging of water. Another difficulty in NMR spectroscopy is the very short spin-spin ($T_2$) relaxation times of some of the chemical moieties. This means that the already small NMR signal produced by these moieties decay rapidly after the application of the RF excitation pulse. Consequently, it is important that the NMR signal be read out as soon as possible after termination of the RF excitation pulse. Therefore, the localization method used with spectroscopy must not lengthen the pulse sequence such that the NMR signal has decayed to an unacceptable low level by the time it is acquired.

One commonly used method for localizing the NMR signal in NMR spectroscopy studies employs a surface-coil that is positioned on the patient, immediately adjacent to the organ of interest. This method relies on the restricted range of sensitivity of the surface-coil to provide localization in the dimensions transverse to the central axis of the coil. Depth localization along the central axis of the coil is typically achieved by a one-dimensional phase encoding pulse which is produced during the pulse sequence. While the local coil is clearly more sensitive to NMR signals produced along its central axis, the surface-coil does pick up NMR signals from the surrounding region, particularly at greater depths. Thus, while the surface coil may be most sensitive to NMR signals produced by the organ of interest, the NMR signals from surrounding tissues may contribute enough to the total signal "seen" by the surface-coil to substantially distort the metabolite concentration measurements.

Such measurement errors can be partially corrected by employing a one-dimensional slice selective RF excitation pulse in each NMR pulse sequence. For example, if the surface-coil lies in the X-Z plane, a $G_z$ gradient may be applied concurrently with the RF excitation pulse to excite a slab of spins that include the organ of interest. Spins lying outside the excited slab along the Z axis will not contribute to the acquired NMR signal, and will not, therefore, distort the metabolite measurement. When combined with a $G_y$ phase encoding gradient applied during the pulse sequence, the region of interest is localized along 2 of 3 dimensions. While such two-dimensional localization is adequate for some measurements, it is not adequate for others.

More recently, three-dimensional localization has been achieved in NMR spectroscopy by using a so called two-dimensional selective excitation. In contrast to the well-known one-dimensional, slice selective, excitation which employs a constant magnetic field gradient during the application of the RF excitation pulse, two-dimensional selective excitation is achieved by applying two, orthogonal, time varying magnetic field gradients concurrently with the RF excitation pulse. In the above example, a $G_z$ gradient and $G_x$ gradient are applied during each excitation pulse. As described in U.S. Pat. No. 4,812,760 entitled "Multi-Dimensional Selective NMR Excitation With A Single RF Pulse", the time variations in the two orthogonal gradients and the amplitude envelope of the concurrent RF excitation pulse can be chosen to provide different shaped excitation patterns. In general, these two-dimensional selective excitation pulses are shaped to produce a cylindrical volume of excited spins located directly beneath the surface-coil and concentric with its central axis. Phase encoding is then used to locate spins along the length of the cylinder and to thereby provide the third dimension of localization.

A more recent variation of the two-dimensional selective excitation pulse is disclosed in an article by John Pauly et al. entitled "k Space Analysis Of Small-tip-angle Excitation", *Journal of Magnetic Resonance* 81, 43–56 (1989). This method excites a cylindrical region by producing two orthogonal gradients which vary sinusoidally and diminish to zero during the application of the RF excitation pulse. These gradient waveforms are illustrated in FIG. 1A and the amplitude envelope of the concurrent RF excitation pulse is illustrated in FIG. 1B. This method of two-dimensional selective excitation is referred to in the art as "spiral two-dimensional selective excitation" because the vector sum of the two applied orthogonal gradients map out a spiral pattern in k-space. The spiral pattern is illustrated in FIG. 3 and the resulting two-dimensional NMR sensitivity profile is illustrated in FIG. 1C. One of the added benefits of the spiral k-space trajectory is that the spins are not only transversely magnetized in the desired cylindrical-shaped region of interest, but they are also rephased. As a result, a subsequent rephasing gradient lobe is not required in the pulse sequence and the NMR signal can be acquired sooner with less $T_2$ decay.

There are two problems which have heretofore limited the use of two-dimensional selective excitation in phosphorus-31 and carbon-13 spectroscopy and the like. The first limitation is the rate at which the amplitude of the magnetic field gradients can be changed. The gradient coils on whole body NMR scanners have substantial inductance and their slew rate is limited. As a result, to perform the spiral excitation illustrated in FIG. 1 within the slew rate limits of the NMR system, the RF excitation pulse may have to extend up to 20 milliseconds in duration resulting in substantial loss of signal from short $T_2$ components.

Another limitation of prior methods using two-dimensional selective excitation pulses is the reduced bandwidth of the excitation. The bandwidth of the NMR excitation is inversely proportional to the duration of the selective excitation pulse. As indicated above, because of slew rate limitations in the gradient field generators, such pulses become very lengthy. The net result is a reduction in the breadth of the spectrum that is excited Referring to FIG. 2, for example, a phosphorus-31 spectrum showing a number of important metabolites requires a bandwidth of 30 ppm if the relative concentrations of all these metabolites is to be measured. If the two-dimensional excitation pulse requires eight times as long to complete, the useful spectrum that is excited will be significantly reduced and may not contain all, or even two, of the metabolite peaks that are to be compared.

SUMMARY OF THE INVENTION

The present invention is a method and apparatus for acquiring spectroscopic NMR data using localization that includes a two-dimensional selective excitation pulse that does not exceed the gradient field slew rate nor decrease the bandwidth of the excited NMR signal. More specifically, the invention includes the acquisition of the NMR data from which a spectrum is to be produced using a series of pulse sequences, in which each pulse sequence includes a two-dimensional selective excitation pulse which traverses a different portion of k-space, and the NMR signals acquired in each of the pulse sequences are added together to form the NMR signal which is processed to produce the desired spectrum. By adding the NMR signals together, signal contributions from spins located outside the selected region of interest substantially cancel.

A general object of the invention is to provide localization using a two-dimensional selective excitation that does not exceed the slew rates of the gradient fields. By breaking up k-space into small portions, each portion can be traversed using gradients that cycle, or change, at a limited slew rate. For example, rather than traverse the entire k-space with a single spiral as shown in FIG. 3, each selective excitation may traverse a single arm in the pinwheel shown in FIG. 4.

Another general object of the invention is to maintain the desired bandwidth in the excited NMR signal. Because only a portion of k-space is traversed by each pulse, the two-dimensional selective excitation pulse can be shortened considerably without exceeding the gradient slew rate limits. This reduction in excitation time translates directly into an increase in bandwidth of the excited NMR signal. When the broadband NMR signals from each pulse sequence in the series are added together and the sum is Fourier transformed, a broad spectrum is produced from the localized region of interest.

Yet another object of the invention is to provide a method for in vivo NMR spectroscopy which provides localization without degradation of the signal-to-noise ratio. A single, phase encoding gradient pulse can be applied during each pulse sequence in the series to provide localization in the third dimension. There are no further pulses required and the NMR signal can be promptly acquired before short-$T_2$ decay degrades the signal. The pulse sequence is kept short since the need for any gradient field rephasing lobes is eliminated. This is accomplished by judiciously selecting the portion of k-space which is to be traversed during each excitation, and by judiciously selecting the path to be followed in traversing the selected trajectory. In the preferred embodiments a spiral path is employed and when the entire series is completed, these spirals form a pinwheel pattern which covers all of k-space.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

BRIEF DESCRIPTION OF THE DRAWINGS

FIG. 7A is a graphic representation of the pulse sequence employed in the preferred embodiment of the invention;

FIG. 7B is a schematic representation of the NMR data acquired using the pulse sequence of FIG. 7A;

DESCRIPTION OF THE PREFERRED EMBODIMENT

Figure 5:
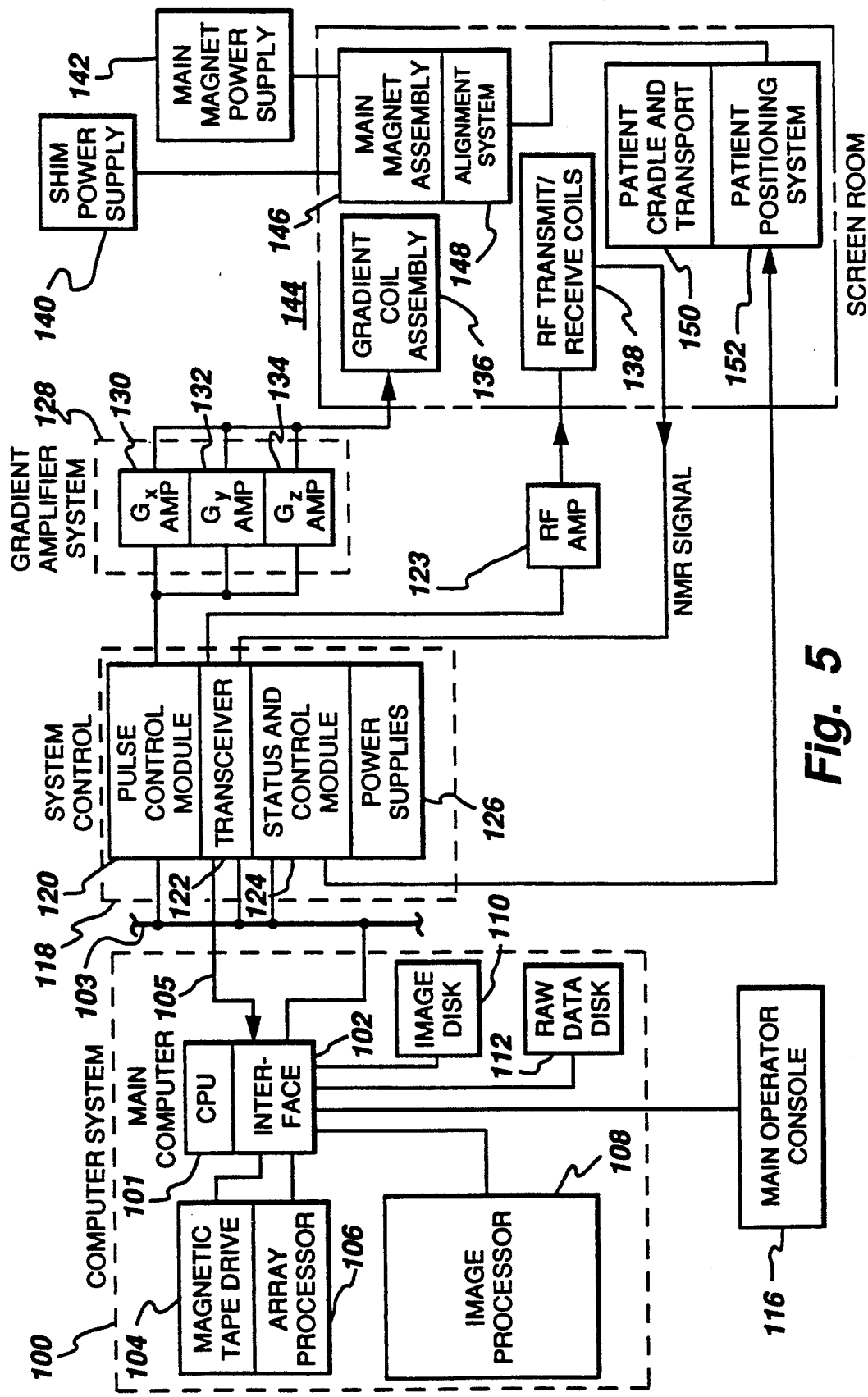
FIG. 5 is an electrical block diagram of an NMR system which employs the present invention.

Referring to FIG. 5, there is shown in block diagram form the major components of a preferred NMR system which incorporates the present invention and which is sold by the General Electric Company under the trademark "SIGNA". The overall operation of the system is under the control of a host computer system generally designated 100 which includes a main computer 101 (a Data General MV4000). The computer 100 includes an interface 102 through which a plurality of computer peripheral devices and other NMR system components are coupled to the main computer 101. Among the computer peripheral devices is a magnetic tape drive 104 which may be utilized under the direction of the main computer 101 for archiving patient data and image data to tape. Processed patient data may also be stored in an image disc storage device designated 110. An array processor 106 is utilized for preprocessing acquired NMR data and for image reconstruction. The function of image processor 108 is to provide interactive image display manipulation such as magnification, image comparison, gray-scale adjustment and real time data display. The computer system 100 also includes a means to store raw NMR data (i.e. before image construction) which employs a disc data storage system designated 112. An operator console 116 is also coupled to the main computer 101 by means of interface 102, and it provides the operator with the means to input data pertinent to a patient study as well as additional data necessary for proper NMR system operation, such as calibrating, initiating and terminating scans. The operator console is also used to display images stored on disc or magnetic tape.

The computer system 100 exercised control over the NMR system by means of a system control 118 and a gradient amplifier system 128. Under the direction of a stored program, the computer 100 communicates with system control 118 by means of a serial communication network 103 (such as the Ethernet network) in a manner well known to those skilled in the art. The system control 118 includes several subsystems such as a pulse control module (PCM) 120, a radio frequency transceiver 122, a status control module (SCM) 124, and power supplies generally designated 126. The PCM 120 utilizes control signals generated under program control by main computer 101 to generate digital waveforms which control gradient coil excitation, as well as RF envelope waveforms utilized in the transceiver 122 for modulating the RF excitation pulses. The gradient control waveforms are applied to the gradient amplifier system 128 which is comprised of $G_x$, $G_y$ and $G_z$ amplifiers 130, 132 and 134, respectively. Each amplifier 130, 132 and 134 is utilized to excite a corresponding gradient coil in an assembly designated 136 which is part of a magnet assembly 146 When energized, the gradient coils generate magnetic fields which have gradients $G_x$, $G_y$ and $G_z$ that are directed along the respective orthogonal axes x, y and z. The amplitude and polarity of these gradients are determined by the amplitude and polarity of the control signals produced by the pulse control module 120. As will be described in more detail below, these control signals produce magnetic field gradients which follow precise waveforms that are necessary to practice the present invention The gradient magnetic fields are utilized in combination with radio frequency pulses generated by transceiver 122, RF amp 123 and RF coil 138 to selectively excite spins in the region of interest. Control signals provided by the pulse control module 120 are utilized by the transceiver subsystem 122 for RF carrier amplitude modulation and mode control. In the transmit mode, the transmitter provides a radio frequency signal to an RF power amplifier 123 which then energizes an RF coil 138A which is situated within main magnet assembly 146. The NMR signals radiated by the excited spin in the patient are sensed by a different RF coil 138B and the signals are detected, amplified, demodulated, filtered, and digitized in the receiver section of the transceiver 122. The processed signals are transmitted to the main computer 101 by means of a dedicated, unidirectional, high-speed digital link 105 which links interface 102 and transceiver 122.

The PCM 120 and SCM 124 are independent subsystems both of which communicate with main computer 101, peripheral systems, such as patient positioning system 152, as well as to one another by means of serial communications link 103. The PCM 120 and SCM 124 are each comprised of a 16-bit microprocessor (such as Intel 8086) for processing commands from the main computer 101. The SCM 124 includes means for acquiring information regarding patient cradle position, and the position of the moveable patient alignment light fan beam (not shown). This information is used by main computer 101 to modify image display and reconstruction parameters. The SCM 124 also initiates functions such as actuation of the patient transport and alignment systems.

The gradient coil assembly 136 and the RF transmit and receiver coils 138 are mounted within the bore of the magnet utilized to produce the polarizing magnetic field. The magnet forms a part of the main magnet assembly which includes the patient alignment system 148, a shim coil power supply 140, and a main magnet power supply 142. The main power supply 142 is utilized to bring the polarizing magnetic field produced by the magnet to the proper operating strength of 1.5 Tesla and is then disconnected.

To minimize interference from external sources, the NMR system components comprised of the magnet, the gradient coil assembly, and the RF transmit and receiver coils, as well as the patient-handling devices, are enclosed in an RF shielded room generally designated 144. The shielding is generally provided by a copper or aluminum screen network which encloses the entire room. The screen network serves to contain the RF signals generated by the system, while shielding the system from RF signals generated outside the room.

Figure 6:
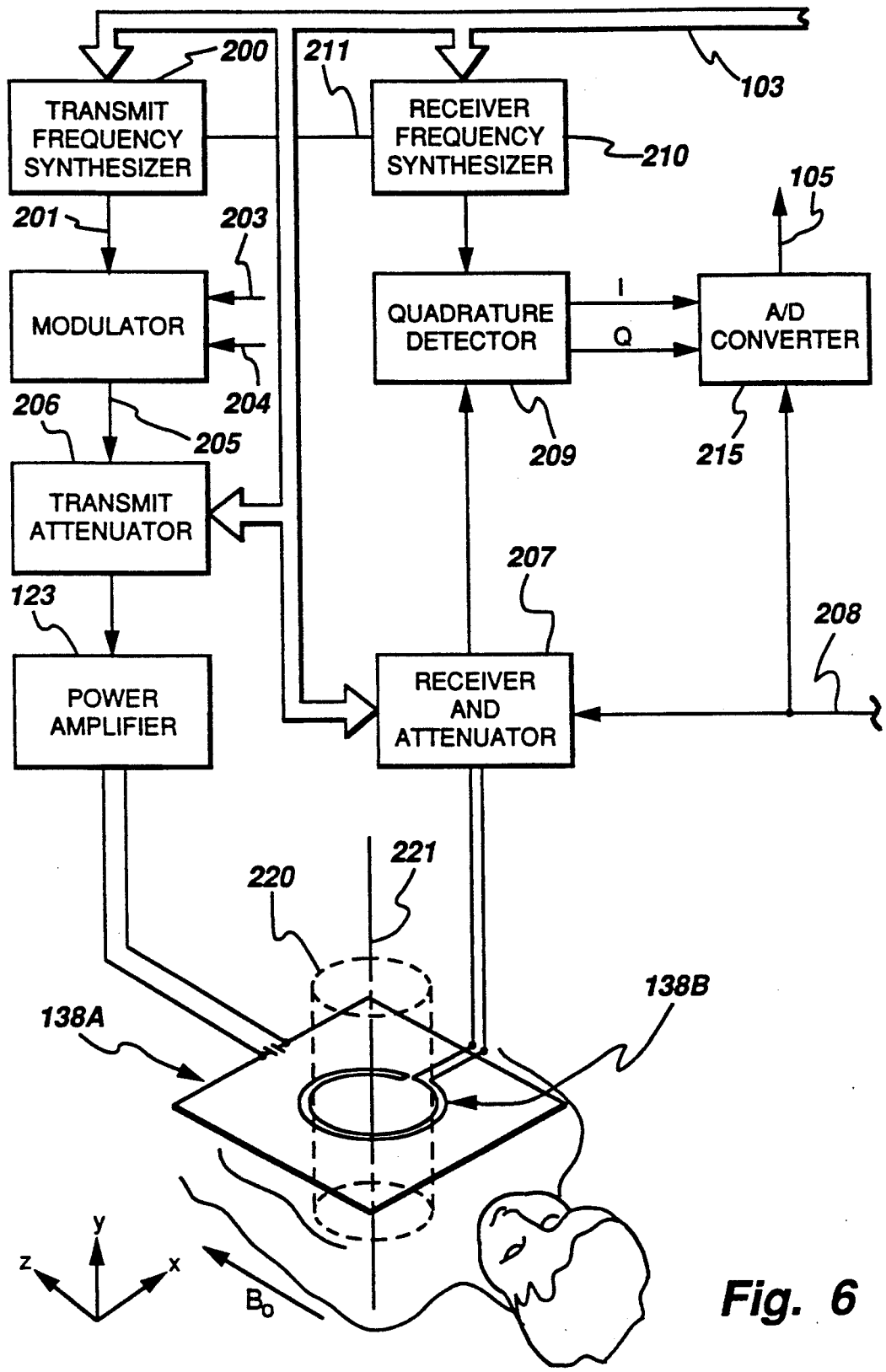
FIG. 6 is an electrical block diagram of the transceiver and RF transmit/receive coils which form part of the NMR system of FIG. 5.

Referring particularly to FIGS. 5 and 6, the transceiver 122 includes components which produce the RF excitation field $B_1$ through power amplifier 123 at a coil 138A and components which receive the resulting NMR signal induced in a coil 138B. The base, or carrier, frequency of the RF excitation field is produced by a frequency synthesizer 200 which receives a set of digital signals through the communications link 103 from the main computer 101. These digital signals indicate the frequency which is to be produced at an output 201 at a resolution of one Hertz. In phosphorus-31 spectroscopy this frequency is set to 25.9 MHz. This commanded RF carrier signal is applied to a modulator 202 where it is amplitude modulated in response to control signals received through line 203 from the PCM 120. The resulting RF excitation signal is turned on and off in response to a control signal which is also received from the PCM 120 through line 204. The magnitude of the RF excitation pulse output through line 205 is attenuated by a transmit attenuator circuit 206 which receives a digital signal from the main computer 101 through communications link 103. The attenuated RF excitation pulses are applied to the power amplifier 123 that drives the RF transmit coil 138A.

Referring still to FIGS. 5 and 6, the NMR signal produced by the excited spins in the subject is picked up by the receiver coil 138B and applied to the input of a receiver 207. The receiver 207 amplifies the NMR signal and this is attenuated by an amount determined by a digital attenuation signal received from the main computer 101 through link 103. The receiver 207 is also turned on and off by a signal through line 208 from the PCM 120 such that the NMR signal is acquired only over the time intervals required by the particular acquisition being performed.

The received NMR signal is demodulated by a quadrature detector 209 to produce two signals I and Q that are received by a pair of analog to digital converters indicated collectively at 215. The quadrature detector 209 also receives an RF reference signal from a second frequency synthesizer 210 and this is employed by the quadrature detector 209 to sense the amplitude of that component of the NMR signal which is in phase with the transmitter RF carrier (I signal) and the amplitude of that component of the NMR signal which is in quadrature therewith (Q signal).

The I and Q components of the received NMR signal are continuously sampled and digitized by the A/D converter 218 at a sample rate of 128 kHz to 1 MHz throughout the acquisition period. A set of 256 digital numbers are simultaneously acquired for each I and Q component of the NMR signal, and these digital numbers are conveyed to the main computer 101 through the serial link 105.

Referring particularly to FIG. 6, the transmit coil 138A is a 40-cm-square surface coil which is placed over the patient and is oriented co-planar with the x-z plane. The excitation coil 138A has distributed capacitance and is tuned to 25.9 MHz, which is the Larmor frequency of phosphorus-31 at the 1.5 T polarizing field strength of the NMR system. The details of the transmit coil construction are disclosed in an article by Paul A. Bottomley et al, *Magnetic Resonance In Medicine*, 14,425–434 (1990) entitled "Phosphate Metabolite Imaging and Concentration Measurements in *Human Heart by Nuclear Magnetic Resonance."

The receive coil 138B is a circular surface coil which is disposed in the same plane as the transmit coil 138A and includes a set of capacitive elements (not shown) which tune it to the 25.9 MHz Larmor frequency of phosphorus-31. the radius of the receive coil 138B is approximately 3.25 cm and its region of maximum sensitivity coincides with a circular, cylindrical region of interest indicated by dashed lines 220 that extends along a central axis 221 which passes through the center of the receive coil 138B. For a more detailed description of the receive coil 138B, reference is made to co-pending U.S. patent application Ser. No. 07/370,518, filed Jun. 23, 1989 and entitled "NMR Probe With Multiple Isolated Coplanar Surface Coils".

The transmit coil 138A and receive coil 138B are positioned over the patient as shown such that the cylindrical region of interest 220 includes the organ in which the metabolite concentrations are to be measured. It is a primary objective of the present invention to sharply define this cylindrical region of interest by localizing the region that is excited by the transmit coil 138A using the two-dimensional selective excitation pulse of the present invention.

It should be apparent to those skilled in the art that when carbon-13 or hydrogen-1 spectroscopy is performed the coils 138A and 138B must be tuned to the Larmor frequencies of those spins. In the preferred embodiment, these are 16.1 MHz for carbon-13 and 63.8 MHz for hydrogen-1.

Referring particularly to FIG. 7A, the pulse sequence used to practice the preferred embodiment of the invention includes a two-dimensional selective excitation pulse 225 comprised of an RF excitation pulse 226 and a pair of simultaneously applied gradient pulses 227 and 228. The excitation pulse 225 is from 1 to 2 milliseconds in duration and the pulses 227–228 are shaped to map out a spiral arm in k-space as will be described in detail below. The excitation pulse 225 is followed immediately by a phase encoding pulse 230, and the NMR signal is acquired immediately thereafter by enabling the A/D converter 215 (FIG. 6) to digitize 256 samples as indicated at 231. The phase encoding pulse 230 is 1 millisecond in duration and its amplitude is set at one of thirty two values used during the scan.

For each phase encoding value, the pulse sequence of FIG. 7A is cycled eight times. The two-dimensional selective excitation pulse 225 is changed during each cycle to traverse a different portion of k-space, and the 256 sample values which are acquired during each cycle are added to the corresponding values obtained during previous cycles. As shown in FIG. 7B, at the completion of eight cycles, therefore, the eight acquired NMR signals have been summed together and stored as one 256-element line in an acquired data array 240. The phase encoding is then stepped to the next value and another line of NMR data is stored in the array 240 by performing eight more cycles using the pulse sequence of FIG. 7A.

Figure 1A:
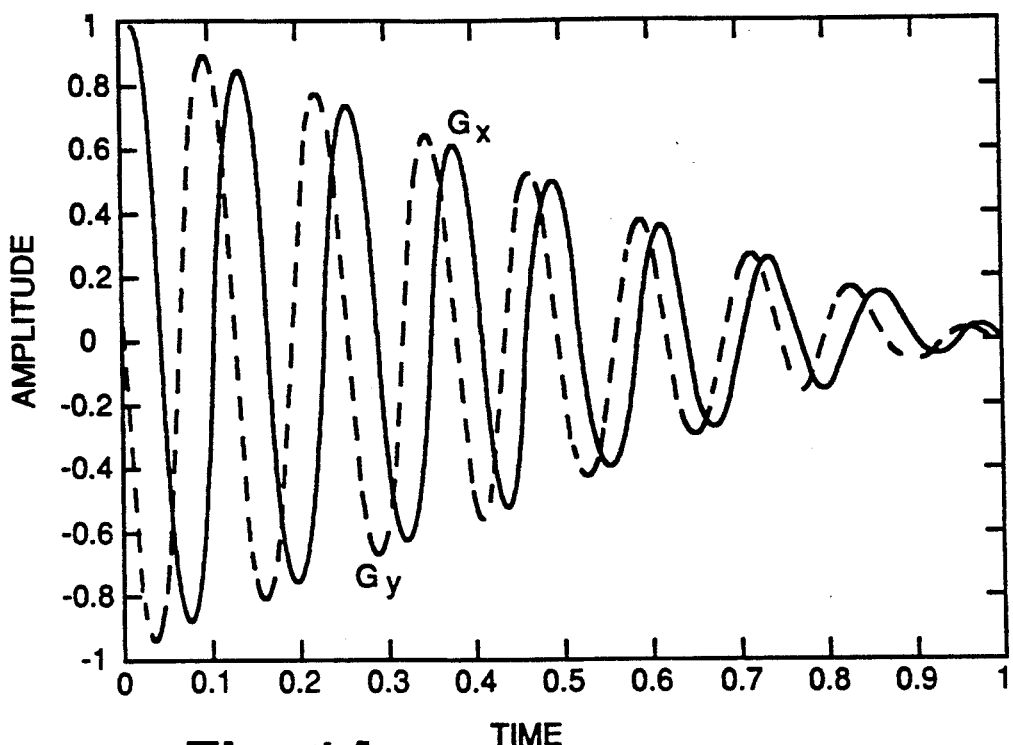
FIGS. 1A-1C are graphic representations of a prior art two-dimensional selective excitation pulse and the resulting cylindrical volume that is excited.
Figure 1B:
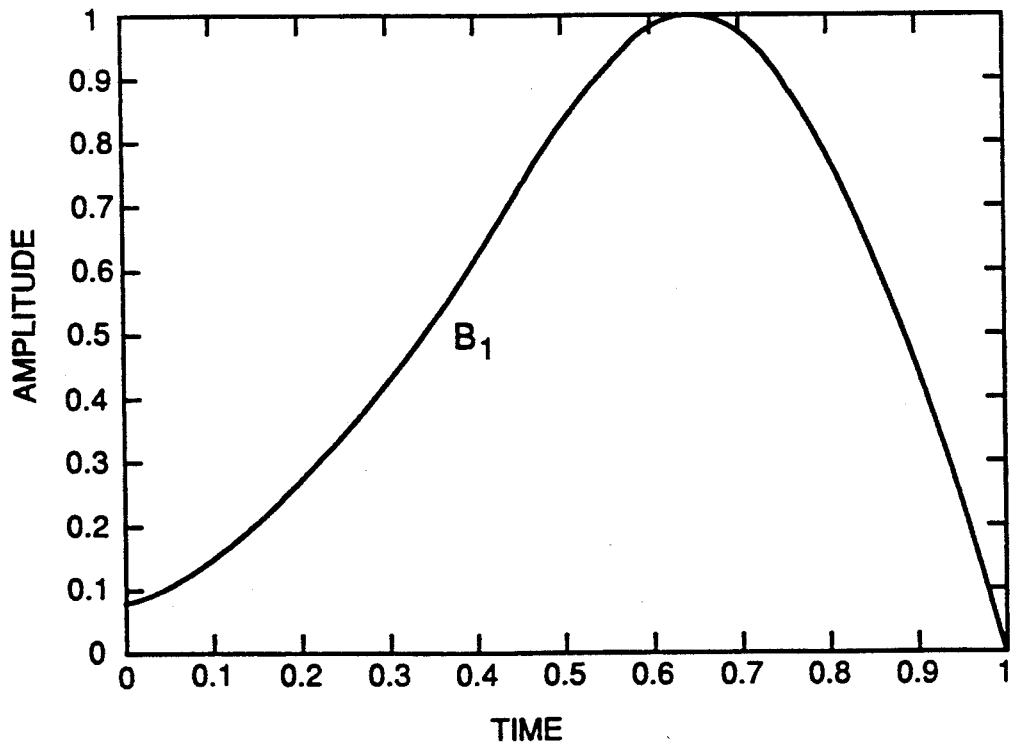
Figure 1C:
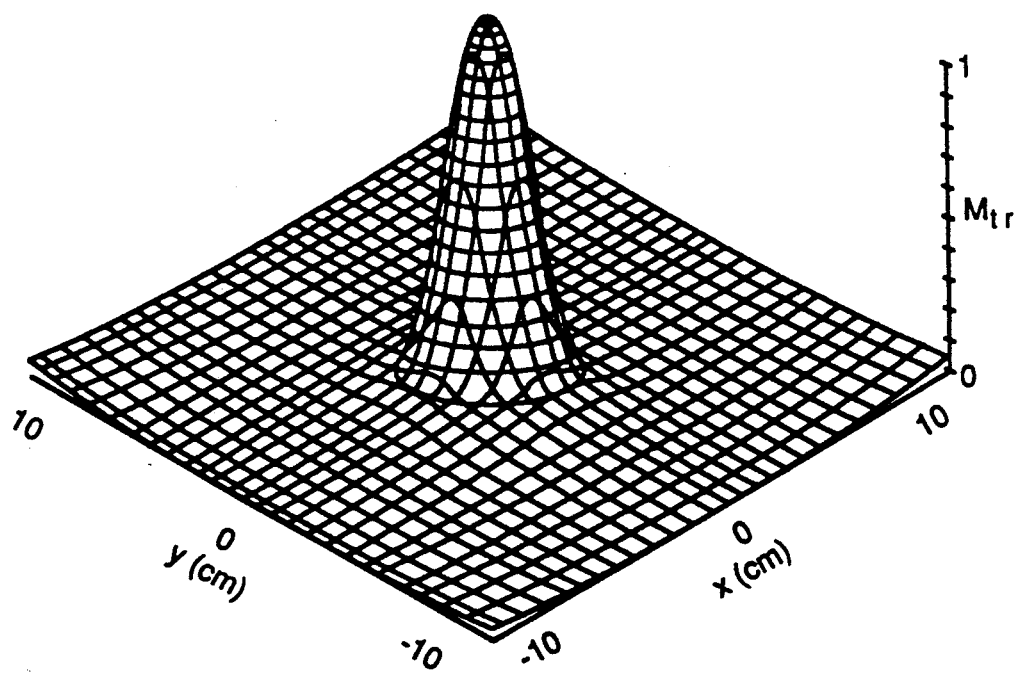
Figure 2:
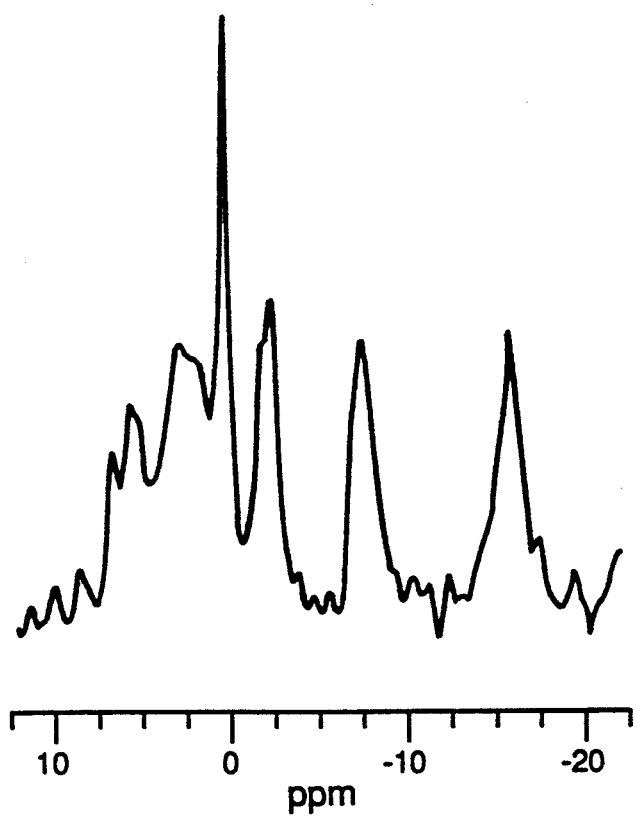
FIG. 2 is a typical NMR spectrum of phosphorus-31 showing the peaks produced by metabolites in the human body.

After NMR data has been acquired for all 32 phase encodings the scan is complete. The acquired data array 240 then stores 32 lines of data with each line containing 256 data elements. Each data element is the sum of eight values acquired during the cycling of the two-dimensional selective excitation pulse 225. A two-dimensional, complex Fourier transformation is performed on the acquired data array 240 to produce 32 spectra which can be plotted as shown in FIG. 2. Each of the 32 spectra measures metabolite concentrations in a disk of spins in the circular cylindrical region of interest 220. Each spectrum thus represents the NMR signals produced by the spins which are localized in three dimensions. It is common practice to also produce a conventional $^1$H image at the same time so that the structures from which the spectroscopic signals are obtained can be precisely determined.

Figure 4:
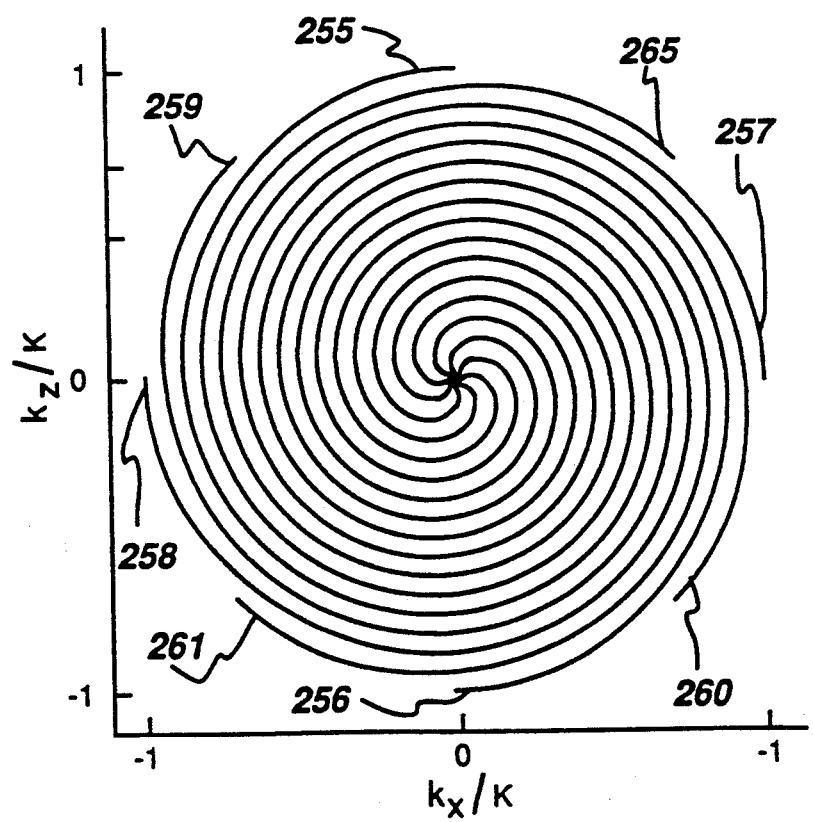
FIG. 4 is a graphic representation of a k-space pattern traversed by a preferred embodiment of the two-dimensional selective excitation trajectory according to the present invention.

The present invention relates to the two-dimensional selective excitation pulse 225 in the pulse sequence of FIG. 7A, and particularly, to the shape of the gradient pulses 227 and 228 and the RF excitation pulse 226. Referring particularly to FIG. 4, the $G_x$ and $G_z$ gradient pulses are shaped to map out in k-space a single spiral arm in the pinwheel pattern. The pulse sequence is executed eight times to map out eight such spiral arms which are equally spaced around the central axis to uniformly excite the circular cylindrical region of interest and to substantially cancel signal contributions from spins located outside the region of interest.

In general we can express a spiral trajectory $\vec{k} = k_x + i k_y$ in the x-y plane as $$\vec{k}(\tau) = \kappa(1 - \tau/T)e^{i\omega\tau} \qquad [1]$$

where $\omega = 2\pi n/T$, n is the number of cycles in the spiral, $\kappa$ is the outer radius of the spiral, $0 \geq \tau \geq T$, and $\tau$ is a parameter indicating position along the spiral, which reaches T at the spiral's end (at the central origin). This can in turn be expressed as some function of time $\tau(t)$;

for a traversal of the spiral at constant angular rate, $\tau = t$ and the pulse length is T. As described by C. J. Hardy and H. E. Cline, J. Appl. Phys. 66, 1513(1989), under conditions where bandwidth is limited by gradient slew rates, the optimal schedule for traversing the spiral is found analytically to be $$\tau(t) = T[1 - (1 - t/T_s)^{\frac{3}{2}}], \quad [2]$$

where $0 \leq t \leq T_s$, the new pulse length $T_s \approx (\frac{2}{3})T$, and we have assumed $(2/\omega T)^2 << (1-t/T)^2$. Note that when t reaches $T_s$, $\tau$ reaches T (i.e. the end of the spiral).

The traversal schedule of equation [2] fails to achieve constant slew rates when n is small, since the above assumption is then invalid. An alternative, numeric approach gives exact curves for this case. These numeric curves can be fit by a polynominal $$\tau(t) = T \sum_{m=1}^{7} \lambda_m(t/T_s)^m, \quad [3]$$

where $\vec{\lambda} = (0.706, 0.117, 0.126, -0.134, 0.007, 0.133)$ and $T_s = 0.705$ T for an n=2 spiral, or $\vec{\lambda} = (0.755, 0.106, 0.192, -0.237, 0.084, 0.324, -0.224)$ and $T_s = 0.755$ T for an n=1 spiral. The gradient waveforms 227 and 228 are the time derivative of the above motion along the k-space spiral:

$$\vec{g} = g_x + ig_y = \left(\frac{\tau}{\gamma}\right) \frac{\partial \vec{k}(\tau)}{\partial \tau} \quad [4a]$$

$$= \left[\frac{\kappa \omega \tau}{\gamma}\right][i(1 - \tau/T) - 1/(\omega T)] e^{i\omega \tau}, \quad [4b]$$

where $\gamma$ is the gyromagnetic ratio and $$\tau = (T/T_s) \sum_{m=1}^{7} m\lambda_m(t/T_s)^{m-1}. \quad [5]$$

The associated RF waveform is a weighted 2D Fourier transform of the desired spatial excitation profile $P_{des}(\vec{r})$, $$\beta_1(t) = \frac{-i|\vec{g}(t)|}{\rho(\vec{k}(t))} \int_{-\infty}^{\infty} \int_{-\infty}^{\infty} P_{des}(\vec{r})e^{i\vec{k}(t)\cdot\vec{r}}dxdy \quad [6]$$

where we have generalized the previously defined expression for $\beta_1(t)$ by dividing the k-space-velocity weighting factor $|\vec{g}(t)|$ by a k-space sampling-density term $\rho(\vec{k}(t))$. The sampling density at location $\vec{k}$ is defined to be $$\rho(\vec{k}) = \delta l(\vec{k})/\delta A(\vec{k}), \quad [7]$$

where $\delta A (\vec{k})$ is a small area of k space centered at $(\vec{k})$ and $\delta l (\vec{k})$ is the length of trajectory enclosed within that area. This term becomes important for trajectories which sample k space nonuniformly, such as the pinwheel, whose sampling density rises dramatically near the origin of k space because of the relatively low values of n typically used.

Equation [6] may be reduced, in the case of cylindrical symmetry, to a Hankel transform:

$$\beta_1(t) = \frac{-2\pi i|\vec{g}(t)|}{\rho(k(t))} \int_0^{\infty} P_{des}(r)r J_0(k(t)r)dr. \quad [8]$$

Here r is the radial coordinate in a cylindrical coordinate system, $k(t) = |\vec{k}(t)|$ is the corresponding radial coordinate in k space, and $J_0(k(t)r)$ is a zero-order Bessel function. We have chosen $P_{des}(r)$ to be a Fermi function $(1 + \exp((r - r_o)/r_w))^{-1}$ to produce a reasonably sharp profile while avoiding Gibbs ringing off the edge of the excited cylindrical region of interest. Here the cylinder radius $r_0 = 4$ cm and the edge width $r_w = 0.6$ cm.

Figure 10:
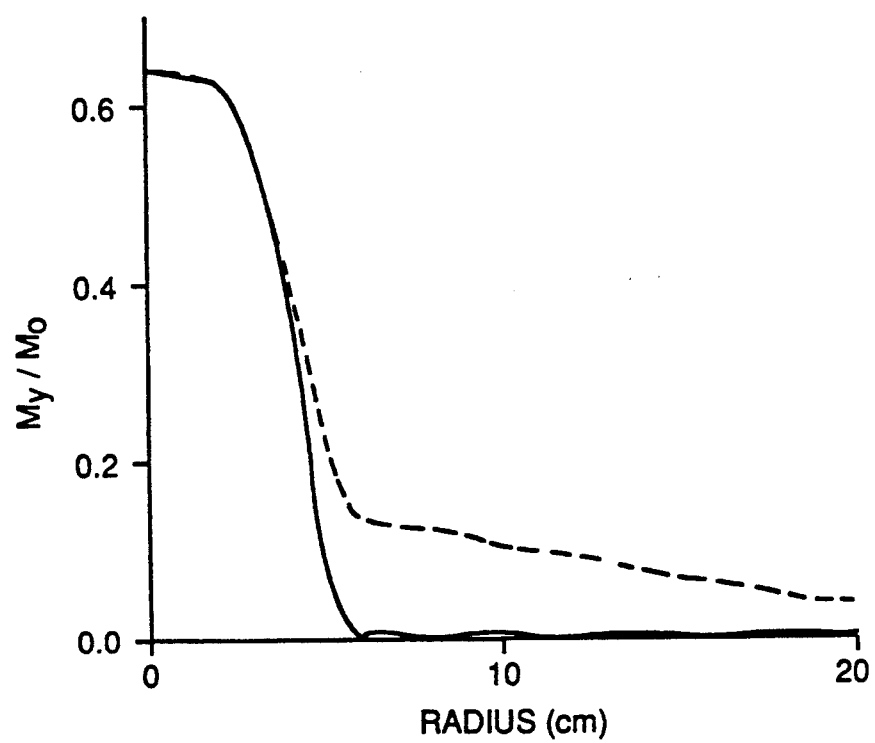
FIG. 10 is a graphic representation of the excitation profile produced according to a preferred embodiment of the present invention.

For the cylindrically symmetric case, the k-space sampling density also has cylindrical symmetry. The differential annular area traversed by the spiral in an interval $\delta \tau$ is $\delta A(k) = 2\pi k(dk/d\tau)\delta\tau$, and $\delta l(k) = \delta\tau\sqrt{(k\omega)^2 + (dk/d\tau)^2}$. The normalized sampling density weighting function used in equation [8] for this case is then $$1/\rho(k(t)) = \frac{wT(1 - \tau(t)/T)}{\sqrt{[wT(1 - \tau(t)/T)]^2 + 1}} \quad [9]$$

where $\tau(t)$ is given by equation [2] or [3], depending on the value of n. This function is essentially constant until the extreme end of the pulse, where it drops sharply to zero. The importance of weighting the RF waveform by the inverse sampling density is illustrated in FIG. 10. This shows the observed radial excitation profile $P_{obs}(r)$, as determined by numerical solution of the Bloch equations, for a 16-arm, 1-cycle pinwheel, for the case where no weighting function $\rho(k(t))$ is used (dotted line) and with the weighting function of equation [9] (solid line). For the former case the extremely low spatial frequencies receive excessive weight in the RF waveform, resulting in a broad baseline component in $P_{obs}(r)$.

Figure 8A:
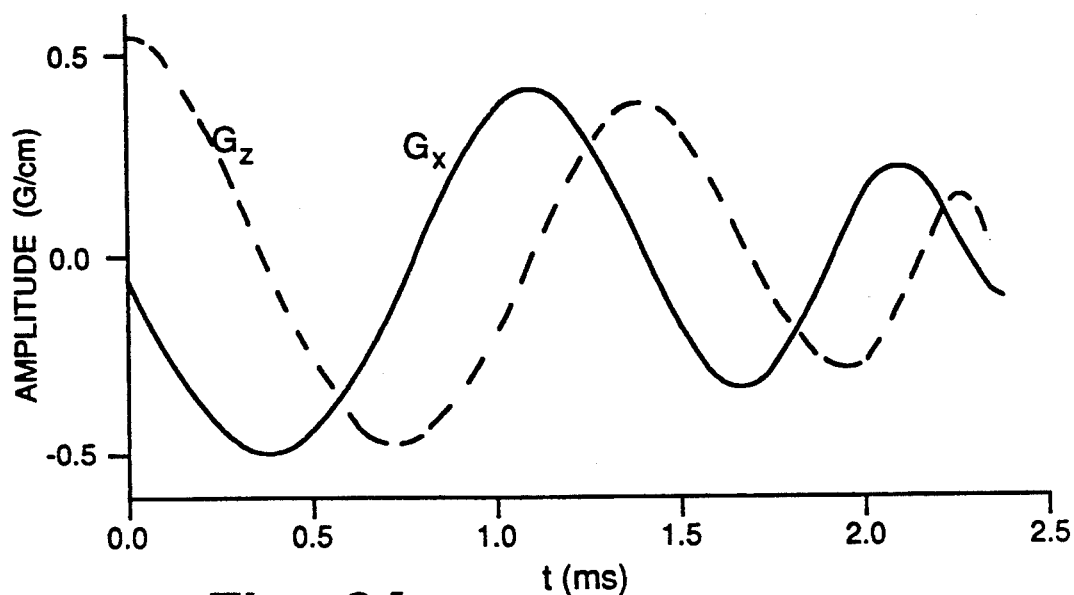
FIGS. 8A-8B are graphic representations of the gradient waveforms and the RF excitation envelope employed in the first preferred embodiment of the invention.
Figure 8B:
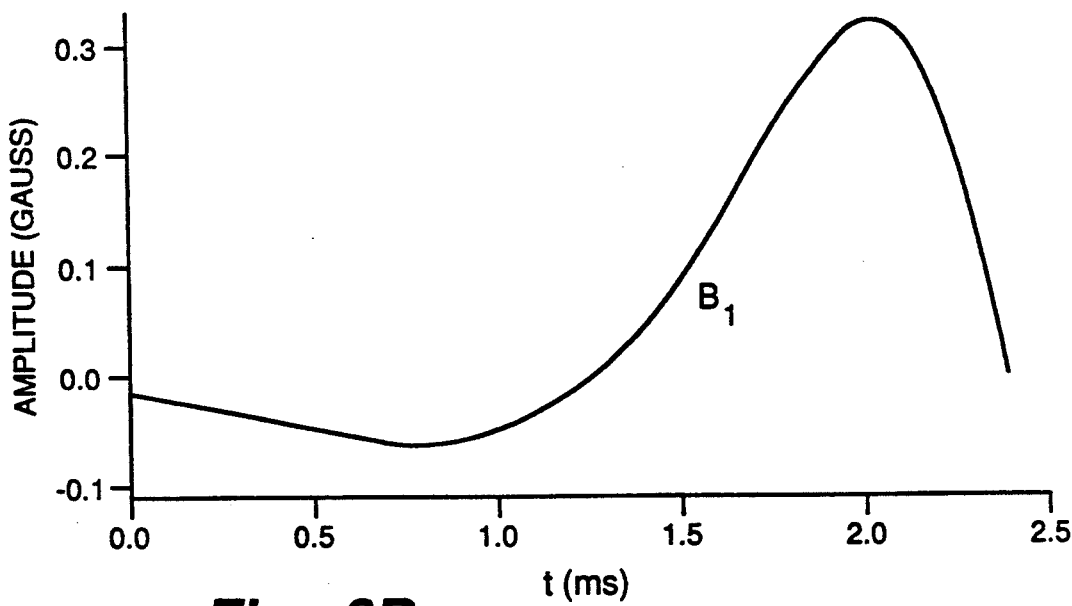
Figure 9A:
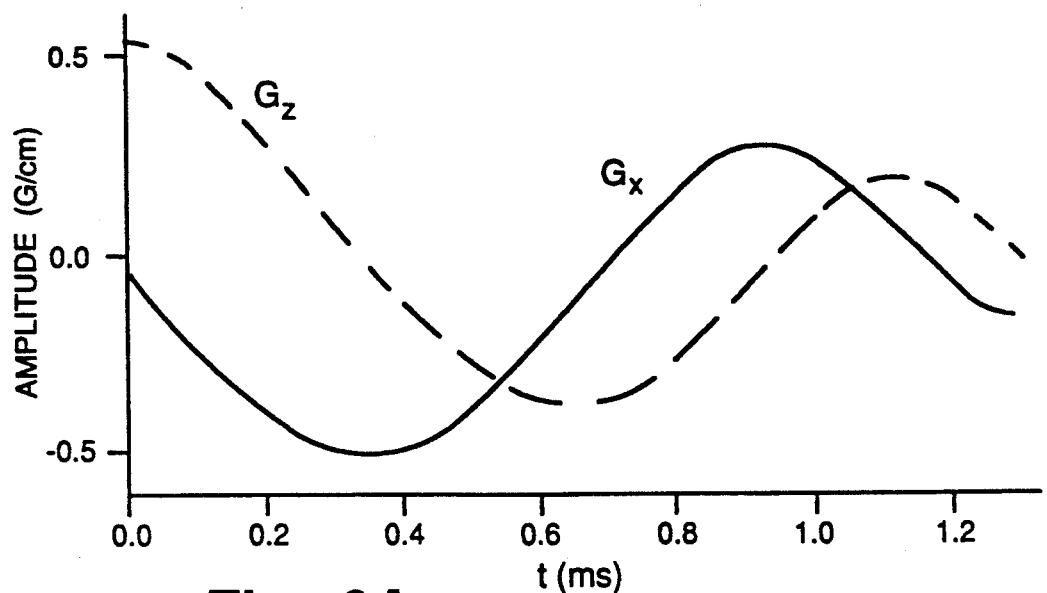
FIGS. 9A-9B are graphic representations of the gradient waveforms and the RF excitation envelope employed in a second preferred embodiment of the invention.
Figure 9B:
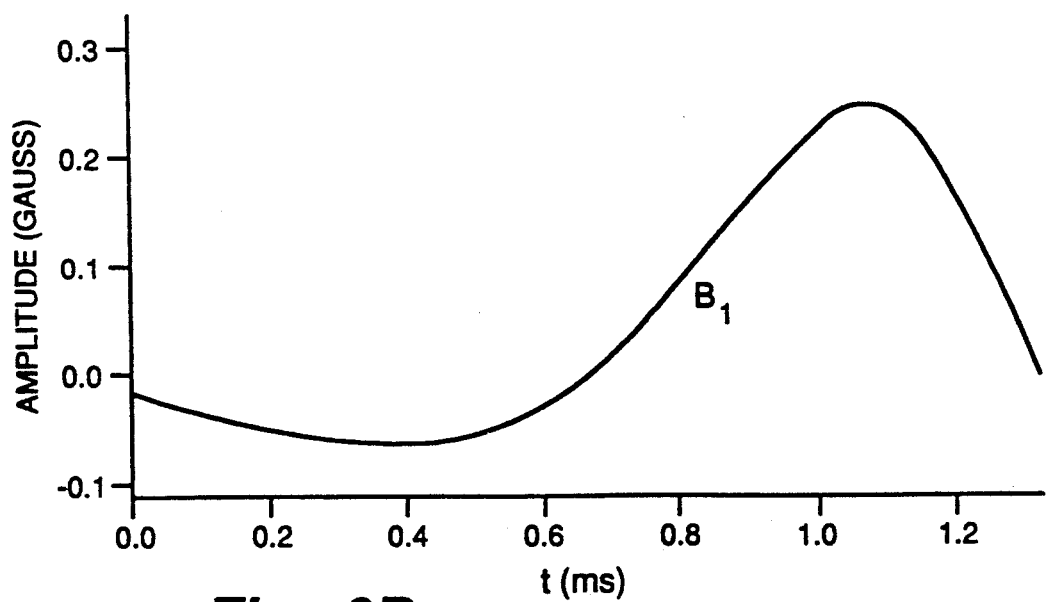

FIGS. 8A and 8B show the gradient and RF excitation waveforms for the pulse of equations [3]−[5], [8]−[9], with $\kappa = 1.6$ radians/cm, for a two cycle (n=2) spiral. FIGS. 9A and 9B show the gradient and RF excitation waveforms for the one cycle spiral (n=1). These waveforms are stored in the PCM 120 and are output to the $G_x$ and $G_z$ gradient amplifiers 130 and 134 (FIG. 5) and the transceiver 122 during the production of the two-dimensional selective RF excitation pulse 225. A spiral arm in the pinwheel pattern of FIG. 4 is thus mapped out in k-space to excite the cylindrical region of interest 220. The gradients of FIGS. 8A and 9A lie within the gradient amplitude and slew rate limits of 1 G/cm and 2 G/cm/ms respectively, that obtain on the NMR system, and produce spectra having roughly twice the bandwidth of the same spirals traversed at a constant angular rate.

To provide adequate coverage of k-space, the pulse sequence of FIG. 7A is repeated N times, and the n-cycle spiral is rotated N times through $(2\pi/N)$ to produce the pinwheel pattern of FIG. 4. An NMR signal is acquired after each arm of the pinwheel is traversed, and after N acquisitions, they are summed together. In practice this means storing the x- and z- gradient waveforms in memory, and mixing them together in various combinations to produce the spiral arm at N equally spaced angles around the origin. To produce the eight spiral arms of FIG. 4, for example, the two waveforms in FIG. 8A are played out directly to produce spiral arm 255 and then their inversions are played out to produce spiral arm 256. Spiral arm 257 is then produced by exchanging the x- and z-gradient waveforms of FIG. 8A and inverting one of them, and spiral arm 258 is produced by reversing the polarity of these waveforms. The remaining four spiral arms 259-262 are produced by combining the waveforms of FIGS. 8A to make two 45° waveforms, and then playing out their various combinations as was done for the spiral arms 255-258.

For cylindrically symmetric excitation profiles, the RF waveform remains unchanged as the gradients are cycled; for asymmetric or offset profiles a new RF waveform is calculated for each arm of the pinwheel, using equation [6]. An eight-arm pinwheel cleanly excites a cylindrical volume, with the aliasing ring artifact pushed out to a radius of $2\pi nN/\kappa \approx 16$ cylinder radii for this pulse. The aliasing radius can be traded off against the edge sharpness of the excited cylinder by varying $\kappa$ and $r_w$ while maintaining $r_o$ constant in equation [8].

Figure 3:
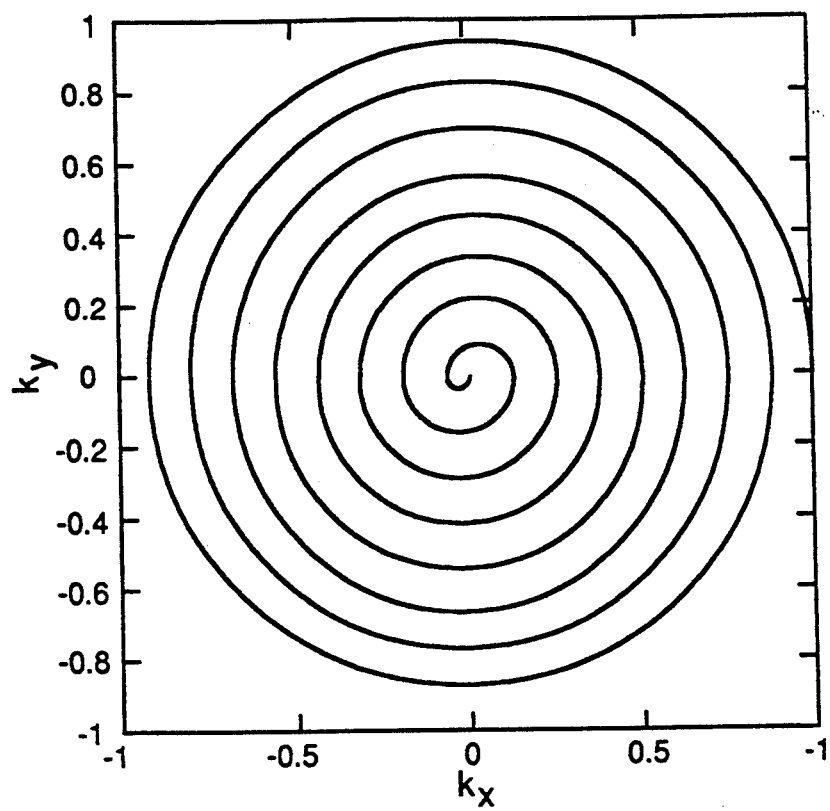
FIG. 3 is a graphic representation of a prior art spiral, two-dimensional selective excitation k-space trajectory.

The combined effect of breaking up the k-space trajectory into separately excited portions and the nonlinear traversal of each spiral arm portion is to greatly increase the bandwidth of the excitation. The bandwidth of the 8-arm, 2-cycle pinwheel is increased by a factor of 14 over the 16-cycle single-spiral shown in FIG. 3, and the 16-arm, 1-cycle pinwheel increases the spectral bandwidth by a factor of 28. Neither of the preferred embodiments exceed the slew rate of the gradient amplifiers.

In theory k-space can be broken up in an almost arbitrary manner in order to separately excite separate portions in accordance with the present invention. However, certain practical limitations reduce the number of real choices and make the pinwheel configuration particularly attractive. For example, each spiral arm of the pinwheel ends at the origin of k-space ($k_x=0$ and $k_y=0$) with the result that no gradient refocusing lobe is necessary. In contrast, if k-space is traversed using a series of concentric circular paths, a refocusing lobe from the termination of the circle to the origin must be added to each pulse sequence. Concentric circles are also relatively inefficient, since the amplitudes of the accompanying RF pulses are constrained by the specified excitation profile P(r) and are in general not 90°. For instance, for a uniform-cylinder excitation the RF pulses accompanying the small circles have a much lower tip angle than those accompanying the large circles. On the other hand, for the pinwheel trajectory each RF pulse is identical and therefore can be set for maximum efficiency.

While a $G_y$ phase encoding pulse is used in the preferred embodiment for localization along the y-axis, a slice-selective inverting pulse may be used instead. In such case, two pulse sequence cycles are required for each spiral arm in the pinwheel and a y-axis slice selective inverting pulse is applied prior to one of each pair of pulse sequences. The two NMR signals acquired from each pair of spiral arm pulse sequences are subtracted producing phase cancellation everywhere but within the selected slice. As in the preferred embodiment, the net signal for each spiral arm is summed to produce an NMR signal from excited spins throughout the region of interest.

It should also be apparent to those skilled in the art that the local coils can be positioned and oriented differently on the patient. In such case the circular cylindrical region of interest excited by the 2-dimensional selective excitation pulse is also reoriented by combining gradient fields $G_x$, $G_y$ and $G_z$ to produce the two orthogonal gradient fields that are perpendicular to its central axis.

What is claimed is:

1. A method for obtaining an NMR chemical-shift spectrum localized to a region of interest within a subject, the steps comprising:
    a) producing a polarizing magnetic field over said subject;
    b) applying a two-dimensional NMR selective excitation pulse to produce an excitation region encompassing said region of interest, the two-dimension selective excitation pulse including the substantially simultaneous application of:
        i) an RF excitation pulse having a bandwidth encompassing a desired portion of the chemical-shift spectrum;
        ii) a first magnetic field gradient pulse which varies in magnetic as a function of time; and
        iii) a second magnetic field gradient pulse which varies in magnitude as a function of time and which is orthogonal to the first magnetic field gradient, in which the vector sum of the time-varying first and second magnetic-field gradient pulses defines a spiral path in k space;
    c) acquiring an NMR signal from the excitation region in the absence of a readout magnetic-field gradient and storing the same;
    d) repeating steps a), b) and c) to obtain and store a set of NMR signals in which the magnetic field gradient pulses applied during step b) are phase-shifted, causing each spiral path in k-space to be rotated for each repeat;
    e) summing together the stored set of NMR signals from each repeat of steps a), b), and c) so that the signals from the region of interest add constructively while the signals outside the region of interest and inside the excitation region substantially cancel one another, to produce a final summed NMR signal from the region of interest, and
    f) applying a Fourier transformation to the final summed NMR signal to produce a chemical-shift spectrum of sufficiently broad bandwidth to encompass peaks from the desired portion of the chemical-shift spectrum.

2. The method as recited in claim 1 which includes applying a phase encoding magnetic field gradient across a region of interest after application of the two-dimensional selective excitation pulse and before acquisition of the NMR signal, and in which the phase encoding magnetic field gradient is orthogonal to the gradients produced by the first and second magnetic field gradient pulses.

3. The method as recited in claim 1 which includes applying a slice select magnetic field gradient and a second RF excitation pulse to the sample before acquisition of the NMR signal, and in which the slice select magnetic field gradient is orthogonal to the gradients produced by the first and second magnetic field gradient pulses.

4. A spectroscopic localization system for obtaining a chemical-shift spectrum from a region of interest of a subject comprising:
    a) a firs magnetic field gradient means which is operable in response to a first gradient control signal to produce a magnetic field gradient along a first axis in a sample;
    b) a second magnetic field gradient means which is operable in response to a second gradient control signal to produce a magnetic field gradient along a second axis in said subject which is orthogonal to the first axis, c) RF excitation means which is responsive to an RF excitation control signal to generate an RF excitation magnetic field that produces transverse magnetization in spins located in said subject; and d) pulse control means for producing said first and second gradient control signals and said RF excitation control signal, said pulse control means being operable to produce a series of said control signals to produce a series of two-dimensional selective excitation pulses of sufficiently short duration that their excitation bandwidth is large enough to encompass a desired portion of a chemical-shift spectrum, each selective excitation pulse comprising an NMR excitation pulse and simultaneous first and second magnetic field gradient pulses, and in which the simultaneous first and second magnetic field gradient pulses vary in amplitude as a function of time to produce transverse magnetization in the spins located in said subject thereby creating an NMR signal, the time varying first and second magnetic field gradient pulses being changed during the production of the series of two-dimensional selective excitation pulses such that when the NMR signals produced from the series of two-dimensional selective excitation pulses are summed together, the NMR signals from spins located outside the region of interest in said subject substantially cancelling.

5. The spectroscopic localization system as recited in claim 4 in which the first and second magnetic field gradient pulses vary in amplitude as a function of time such that the vector sum of the orthogonal field gradients which they produce map out a spiral path.

6. The spectroscopic localization system as recited in claim 4 in which the first and second magnetic field gradient pulses are changed during the production of the series of two-dimensional selective excitation pulses such that a series of interleaved spiral paths are mapped out.

* * * * *